(12) United States Patent
Cao et al.

(10) Patent No.: US 10,571,742 B2
(45) Date of Patent: Feb. 25, 2020

(54) DISPLAY PANEL AND DISPLAY DEVICE

(71) Applicant: Shanghai Tianma Micro-Electronics Co., Ltd., Shanghai (CN)

(72) Inventors: Zhaokeng Cao, Shanghai (CN); Dandan Qin, Shanghai (CN); Min Cai, Shanghai (CN)

(73) Assignee: SHANGHAI TIANMA MICRO-ELECTRONICS CO., LTD., Shanghai (CN)

(*) Notice: Subject to any disclaimer, the term of this patent is extended or adjusted under 35 U.S.C. 154(b) by 138 days.

(21) Appl. No.: 15/990,134

(22) Filed: May 25, 2018

(65) Prior Publication Data

US 2019/0272782 A1    Sep. 5, 2019

(30) Foreign Application Priority Data

Mar. 1, 2018    (CN) .......................... 2018 1 0170408

(51) Int. Cl.
| | |
|---|---|
| *G02F 1/1335* | (2006.01) |
| *G02F 1/1343* | (2006.01) |
| *G02F 1/1368* | (2006.01) |
| *H01L 27/12* | (2006.01) |

(52) U.S. Cl.
CPC ...... *G02F 1/133609* (2013.01); *G02F 1/1368* (2013.01); *G02F 1/134309* (2013.01); *G02F 2201/121* (2013.01); *G02F 2201/123* (2013.01); *H01L 27/124* (2013.01)

(58) Field of Classification Search
CPC ............. G02F 1/1368; G02F 1/134309; G02F 1/133609; G02F 2201/123
See application file for complete search history.

(56) References Cited

U.S. PATENT DOCUMENTS

| 10,018,878 B2* | 7/2018 | Liu .................... G02F 1/136286 |
|---|---|---|
| 2008/0143897 A1* | 6/2008 | Chang ............... G02F 1/134363 349/33 |
| 2009/0231530 A1* | 9/2009 | Nishimura ............ G02F 1/1323 349/129 |

FOREIGN PATENT DOCUMENTS

CN    104865755 A    8/2015

* cited by examiner

*Primary Examiner* — Dung T Nguyen
(74) *Attorney, Agent, or Firm* — Anova Law Group PLLC

(57) ABSTRACT

A display panel and a display device are provided. The display panel comprises: a display area; a non-display area surrounding the display area; and a plurality of primary-color pixels and a plurality of color-mixing pixels disposed in the display area. A primary-color pixel includes a first electrode, and the first electrode includes M number of stripe-shaped first electrode branches. A color-mixing pixel includes a second electrode, and the second electrode includes N number of stripe-shaped second electrode branches, where M>N, and both M and N are integers greater than 0. A width D2 of the second electrode branch is greater than a width D1 of the first electrode branch.

18 Claims, 7 Drawing Sheets

DISPLAY PANEL AND DISPLAY DEVICE

CROSS-REFERENCES TO RELATED APPLICATIONS

This application claims the priority of Chinese Patent Application No. 201810170408.1, filed on Mar. 1, 2018, the entire contents of which are incorporated herein by reference.

FIELD OF THE DISCLOSURE

The present disclosure generally relates to the display technology and, more particularly, relates to a display panel and a display device thereof.

BACKGROUND

As the technology advances and the quality of life improves, display panels and, more particularly, liquid crystal display (LCD) panels, are continuing to develop towards high resolution. As the resolution of display panels continues to increase, in existing technologies, a pixel structure merely including three primary-color pixels, i.e., red, green, and blue pixels, is gradually unable to provide sufficient brightness for all display screens. To solve the problem of insufficient brightness of the display screens, a technical solution of introducing extra color-mixing pixels, such as white pixels, to the display panel has been proposed. The pixel structure including four pixels of red, green, blue, and color-mixing colors improves the brightness of the display screen to some extent, however, also raises certain issues, such as a serious image flicker.

The disclosed display panel and display device thereof are directed to solve one or more problems set forth above and other problems.

BRIEF SUMMARY OF THE DISCLOSURE

One aspect of the present disclosure provides a display panel. The display panel comprises: a display area; a non-display area surrounding the display area; and a plurality of primary-color pixels and a plurality of color-mixing pixels disposed in the display area. A primary-color pixel includes a first electrode, and the first electrode includes M number of stripe-shaped first electrode branches. A color-mixing pixel includes a second electrode, and the second electrode includes N number of stripe-shaped second electrode branches, where M>N, and both M and N are integers greater than 0. A width D2 of the second electrode branch is greater than a width D1 of the first electrode branch.

Another aspect of the present disclosure provides a display device. The display device comprises a display panel. The display panel comprises: a display area; a non-display area surrounding the display area; and a plurality of primary-color pixels and a plurality of color-mixing pixels disposed in the display area. A primary-color pixel includes a first electrode, and the first electrode includes M number of stripe-shaped first electrode branches. A color-mixing pixel includes a second electrode, and the second electrode includes N number of stripe-shaped second electrode branches, where M>N, and both M and N are integers greater than 0. A width D2 of the second electrode branch is greater than a width D1 of the first electrode branch.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
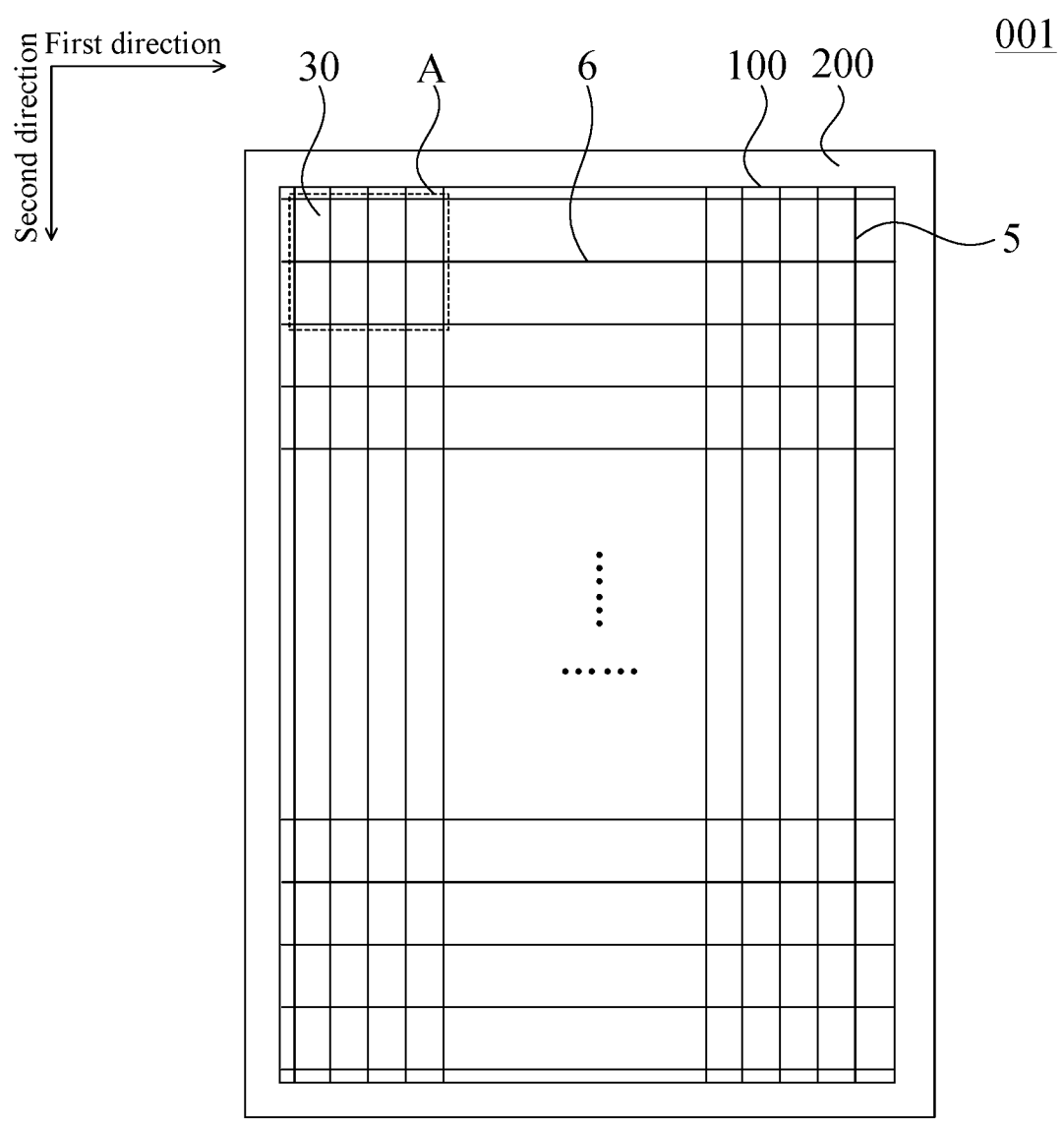
FIG. 1 illustrates a schematic top view of an exemplary display panel consistent with disclosed embodiments.

Reference will now be made in detail to exemplary embodiments of the disclosure, which are illustrated in the accompanying drawings. Hereinafter, embodiments consistent with the disclosure will be described with reference to drawings. In the drawings, the shape and size may be exaggerated, distorted, or simplified for clarity. Wherever possible, the same reference numbers will be used throughout the drawings to refer to the same or like parts, and a detailed description thereof may be omitted.

Further, in the present disclosure, the disclosed embodiments and the features of the disclosed embodiments may be combined under conditions without conflicts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

The present disclosure provides an improved display panel and display device thereof, which are able to enhance the brightness of the display screen and suppress the flickering of the display screen.

The present disclosure provides a display panel. FIG. 1 illustrates a schematic top view of an exemplary display panel consistent with disclosed embodiments, and FIG. 2 illustrates an exemplary enlarged top view of a region A in an exemplary display panel in FIG. 1 consistent with disclosed embodiments.

Figure 2:
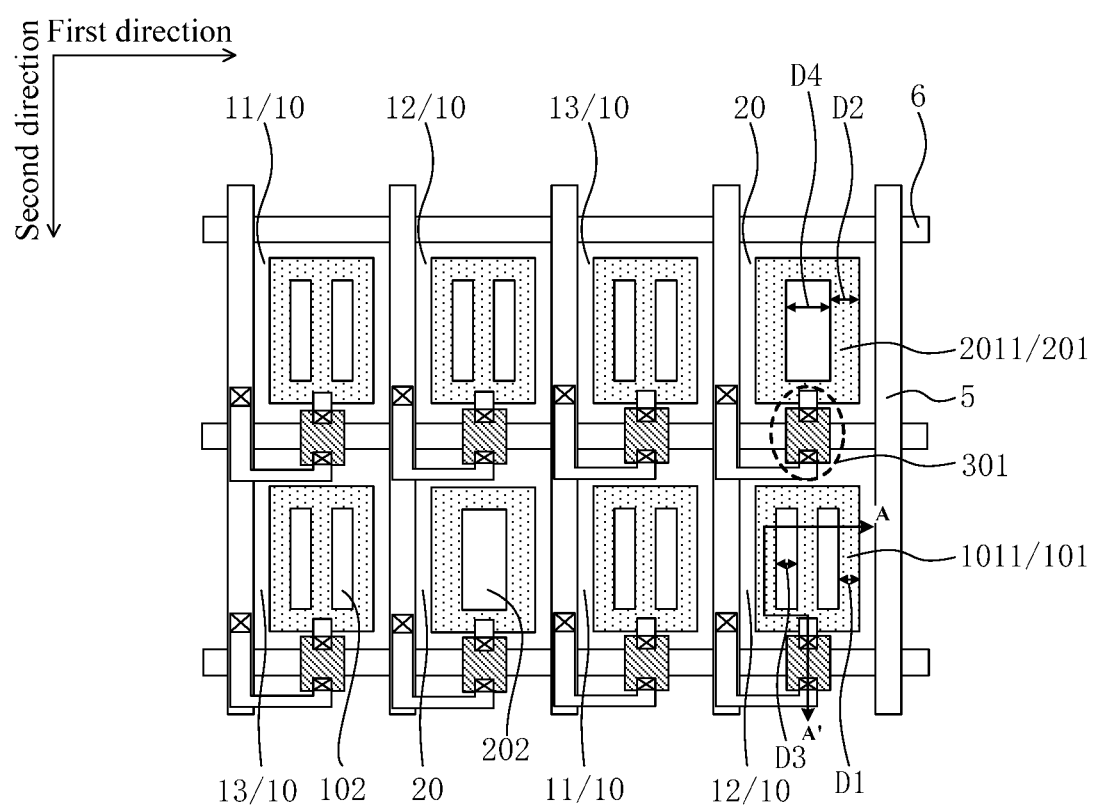
FIG. 2 illustrates an exemplary enlarged top view of a region A in an exemplary display panel in FIG. 1 consistent with disclosed embodiments.

As shown in FIG. 1 and FIG. 2, the display panel 001 may include: a display area 100, a non-display area 200 surrounding the display area 100, and a plurality of primary-color pixels 10 and a plurality of color-mixing pixels 20 disposed in the display area 100. Each primary-color pixel 10 may include a first electrode 101, and the first electrode 101 may include M number of stripe-shaped first electrode branches 1011. Each color-mixing pixel 20 may include a second electrode 201, and the second electrode 201 may include N number of stripe-shaped second electrode branches 2011, where M>N, and both M and N are integers greater than 0. In a first direction, the width D2 of the second electrode branch 2011 may be greater than the width D1 of the first electrode branch 1011. In the disclosed embodiments, the brightness of the display screen may be enhanced and, meanwhile, the flicker of the display screen may be suppressed. That is, the flickering performance of the display panel may be improved.

In the disclosed embodiments, the display panel 001 may be a plasma display panel, a field emission display panel, a light-emitting diode (LED) display panel, an organic light-emitting diode (OLED) display panel, a liquid crystal display panel, a quantum dots (QDs) display panel, an electrophoretic display panel, etc. Further, the display panel may include any appropriate type of display panels which are not limited by the present disclosure.

Figure 3:
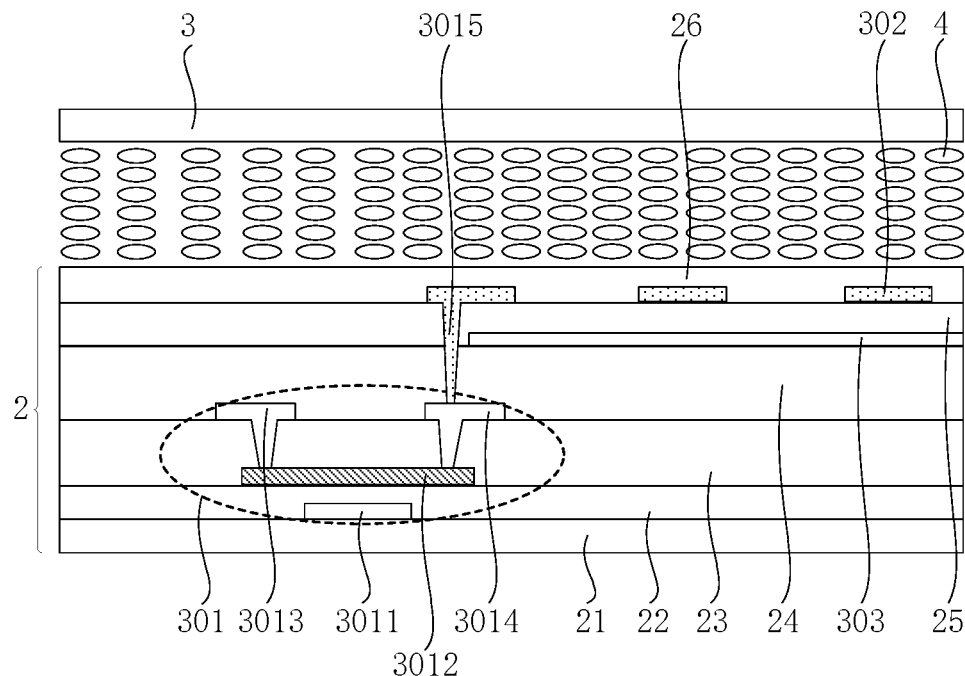
FIG. 3 illustrates an exemplary A-A' sectional view of a region A in FIG. 2 consistent with disclosed embodiments.

FIG. 3 illustrates an exemplary A-A' sectional view of a region A in FIG. 2 consistent with disclosed embodiments. As shown in FIGS. 1-3, the display panel 001 may be a liquid crystal display (LCD) panel, which may include an array substrate 2 and a color film substrate 3 arranged opposite to each other, and liquid crystal molecules 4 sandwiched between the array substrate 2 and the color film substrate 3. A plurality of data lines 5 and a plurality of gate lines 6 may be disposed on the array substrate 2, and the data lines 5 may intersect/cross the gate lines 6 to define a plurality of pixels 30 including the primary-color pixels 10 and the color-mixing pixels 20.

Each pixel 30 may include a thin film transistor (TFT) 301, a pixel electrode 302 and a common electrode 303. The TFT 301 may include a gate electrode 3011, an active layer 3012, a source electrode 3013, and a drain electrode 3014. The source electrode 3013 and the drain electrode 3014 may be electrically connected to the active layer 3012. The gate electrode 3011 may be electrically connected to the corresponding gate line 6, the source 3013 electrode may be electrically connected to the corresponding data line 5, and the drain electrode 3014 may be electrically connected to the corresponding pixel electrode 302 through a through hole 3015.

After the TFT 301 is turned on by the voltage signal on the gate electrode 3011, the display data signal may be transmitted to the pixel electrode 302 through the source electrode 3013 and the drain electrode 3014. Then under the voltage difference between the pixel electrode 302 and the common electrode 303, the liquid crystal molecules 4 may be driven to be reoriented, thereby realizing the display function.

The non-display area 200 of the display panel 001 may be disposed surrounding the display area 100, and may be disposed with peripheral circuits, such as a gate driving circuit, a source driving circuit, a touch-control display circuit, and an electrostatic protection circuit, etc. The primary-color pixels 10 may include red pixels 11, green pixels 12, and blue pixels 13. The color-mixing pixels 20 may include at least one type of white pixels and yellow pixels.

In one embodiment, as shown in FIGS. 2-3, the first electrode 101 and the second electrode 201 may be the pixel electrode 302, and on the array substrate 2, the common electrode 303 may be disposed on a layer different from the first electrode 101 and the second electrode 201. In another embodiment, the first electrode 101 and the second electrode 201 may the common electrode, and on the array substrate 2, while the pixel electrode 302 may be disposed on a layer different from the first electrode 101 and the second electrode 201. Whether the first electrode and the second electrode are the pixel electrode or the common electrode, the operation principle may be similar, and the achieved technical effect may be similar. The specific implementation of the first electrode 101 and the second electrode 201 is not limited by the present disclosure.

Figure 4:
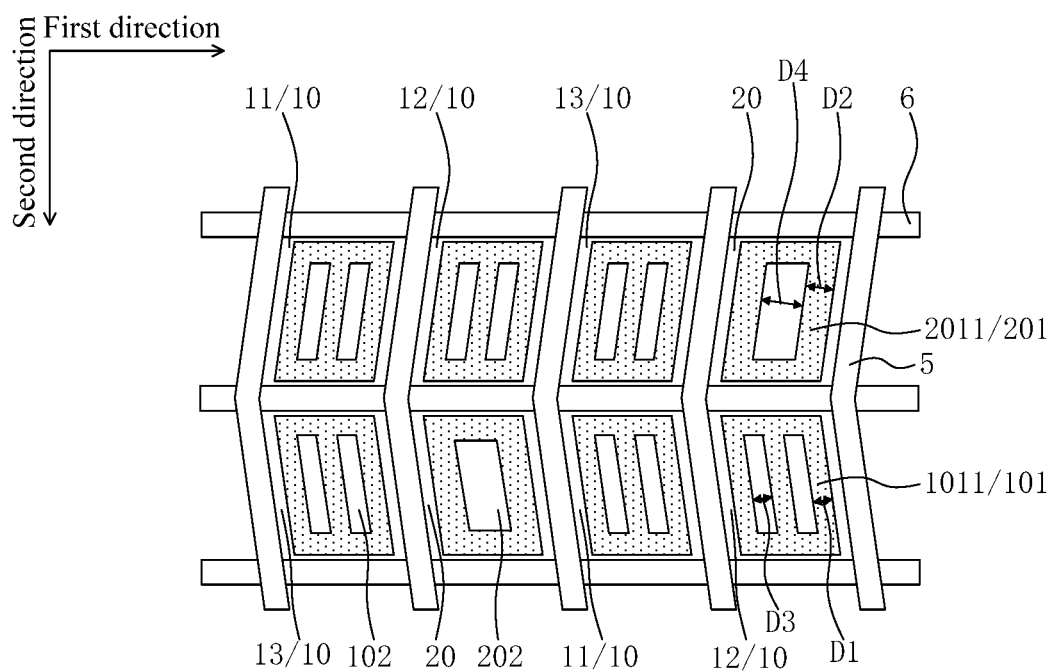
FIG. 4 illustrates another exemplary enlarged top view of a region A in an exemplary display panel in FIG. 1 consistent with disclosed embodiments.

FIG. 4 illustrates another exemplary enlarged top view of a region A in an exemplary display panel in FIG. 1 consistent with disclosed embodiments. The similarities between FIG. 2 and FIG. 4 are not repeated, while certain differences may be explained.

As shown in FIG. 1, FIG. 2 and FIG. 4, in the display area 100, a plurality of gate lines 6 may be extending in a first direction and arranged in a second direction, and plurality of data lines 5 may be extending in the second direction and arranged in the first direction. The extending direction and width direction of the first electrode branch 1011 and the second electrode branch 2011 may be determined according to various application scenarios.

In one embodiment, as shown in FIG. 2, the first electrode branch 1011 and the second electrode branch 2011 each may extend in the second direction, and the width direction of the first electrode branch 1011 and second electrode branch 2011 each may be the first direction. In another embodiment, as shown in FIG. 4, the extending directions of the first electrode branch 1011 and the second electrode branch 2011 may respectively have a same non-right angle or different non-right angles with the first direction. Thus, a "pseudo dual-domain" pixel structure may be formed between two neighboring pixel rows and/or pixel columns, which may increase the uniformity of the displayed images at different viewing angles and, meanwhile, suppress the formation of undesired "dark domain" within the pixels.

Further, the width direction of the first electrode branch 1011 may be perpendicular to the extending direction of the first electrode branch 1011, and the width direction of the second electrode branch 2011 may be perpendicular to the extending direction of the second electrode branch 2011. The extending direction and the width direction of the first electrode branch 1011 and the second electrode branch 2011 are not limited by the present disclosure.

In the disclosed embodiments, the width D 2 of the second electrode branch 2011 in the color-mixing pixel 20 may be configured to be greater than the width D1 of the first electrode branch 1011 in any primary-color pixels 10. Compared to existing display panels in which the width of each electrode branch is equal in different pixels, in the disclosed embodiments, the storage capacitance of the second electrode branch 2011 may be increased and, accordingly, the storage capacitance of the entire second electrode 201 may be increased. Thus, the holding capability of the displayed image may be enhanced, and image flicker may be suppressed.

Further, the number N of the second electrode branches 2011 in each color-mixing pixel 20 may be smaller than the number M of the first electrode branches 1011 in each primary-color pixel 10. In one embodiment, as shown in FIGS. 2 and 4, the number M of the first electrode branches 1011 in the primary-color pixel 10 may be 3, and the number N of the second electrode branches 2011 in the color-mixing pixel 20 may be 2, such that a desired physical space may be provided to increase the width of the second electrode branch 2011.

In the disclosed embodiments, the brightness of the display screen may be enhanced and, meanwhile, the image flicker may be suppressed. That is, the flickering performance of the display panel may be improved. Meanwhile, the color-mixing pixels 20 may be still ensured to increase the brightness of the display screen of the display panel 001.

It should be noted that, the number M of the of the first electrode branches 1011 in the primary-color pixel 10 and the number N of the second electrode branches 2011 in the color-mixing pixel 20 in the accompanying drawings are for illustrative purposes, which is not intended to limit the scope of the present disclosure. In practical applications, as long as the number N of the second electrode branches 2011 in each color-mixing pixel 20 is configured to be smaller than the number M of the first electrode branches 1011 in each primary-color pixel 10, the color-mixing pixel 20 may include any appropriate number of the second electrode branches 2011, and the primary-color pixel 10 may include any appropriate number of the first electrode branches 1011.

Further, as shown in FIG. 3, the array substrate 2 may further include a base substrate 21, a planarization layer 24, and a plurality of insulating layers 22, 23, 25, 26.

In certain embodiments, as shown in FIGS. 1-2, the area of the color-mixing pixel 20 may be equal to the area of the primary-color pixel 10.

As shown in FIG. 2, the primary-color pixels 10 may include red pixels 11, green pixels 12, and blue pixels 13, where the red pixel 11, the green pixel 12, and the blue pixel 13 each may have the same area and configuration. The color-mixing pixel 20 may include at least one type of white pixel and yellow pixel, no matter the color-mixing pixel 20 is a complete white pixel, a complete yellow pixel, a partially yellow pixel, or a partially white pixel, the area of the color-mixing pixel 20 may be equal to the area of any one of the primary-color pixels. As shown in FIG. 2, the area of the pixel (including the color-mixing pixel and the primary-color pixel) may refer to an area enclosed by two adjacent data lines 5 and two adjacent gate lines 6 intersecting the two adjacent data lines 5.

In the disclosed embodiments, the area of the color-mixing pixel 20 may be configured to be equal to the area of the primary-color pixel 10, such that the aspect ratio (length-to-width ratio) of the color-mixing pixel 20 and the primary-color pixel 10 may be the same, which may facilitate the layout/arrangement of the data lines 5 and the gate lines 6, and reduce the fabrication and design costs. Meanwhile, because the area of the color-mixing pixel 20 is equal to the area of the primary-color pixel 10, through increasing the width of the second electrode branch 2011 and correspondingly reducing the number of second electrode branches 2011, the storage capacitance of the second electrode 201 in one color-mixing pixel may be configured to be close or approximately equal to the storage capacitance of the first electrode 101 in one primary-color pixel 10. Thus, the flicker of the image displayed on the display screen may be further suppressed. That is, the flickering performance of the display panel may be further improved.

In the display panel shown in FIG. 4, the area of the color-mixing pixel 20 may also be equal to the area of any one of the primary-color pixels 10, which is similar to the display panel in FIG. 2 and is not described herein again.

In certain other embodiments, the area of the color-mixing pixel 20 may be smaller than the area of the primary-color pixel 10. A corresponding structure is shown in FIG. 5.

Figure 5:
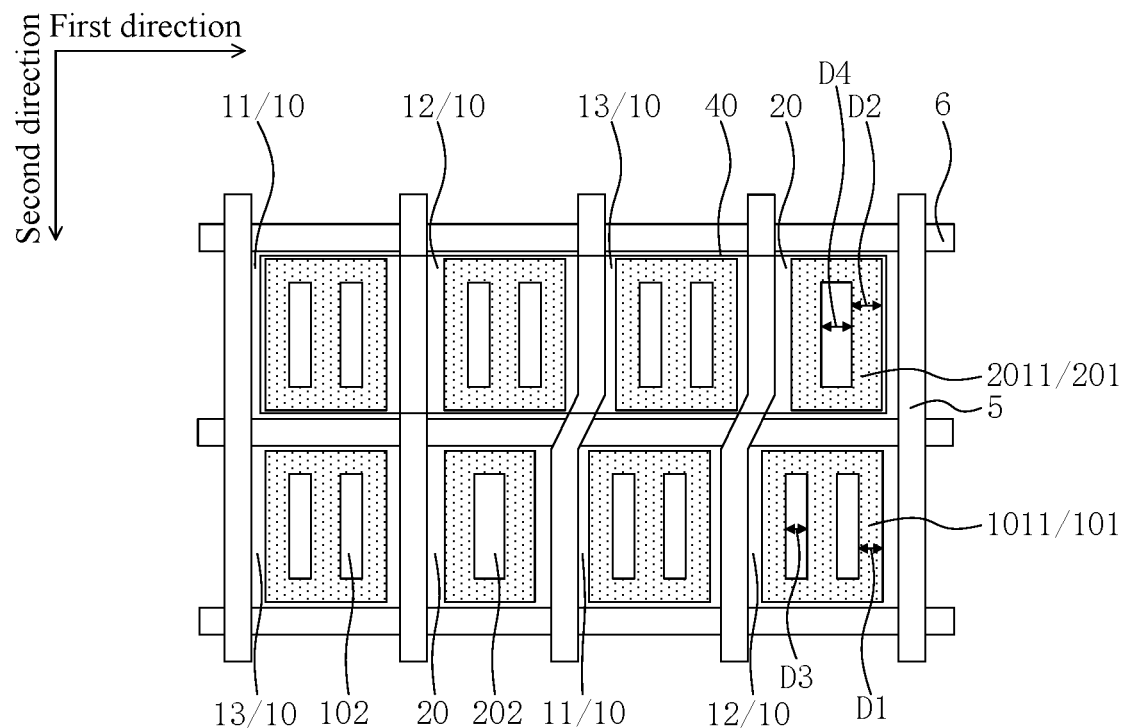
FIG. 5 illustrates another exemplary enlarged top view of a region A in an exemplary display panel in FIG. 1 consistent with disclosed embodiments.

FIG. 5 illustrates another exemplary enlarged top view of a region A in an exemplary display panel in FIG. 1 consistent with disclosed embodiments. The similarities between FIG. 5 and FIG. 2 are not repeated, while certain differences may be explained.

As shown in FIG. 5, the area of the color-mixing pixel 20 may be smaller than the area of the primary-color pixel 10. Referring to FIGS. 1, 3, and 5, the primary-color pixels 10 may include red pixels 11, green pixels 12, and blue pixels 13, where the red pixel 11, the green pixel 12, and the blue pixel 13 each may have the same area and configuration. The color-mixing pixel 20 may include at least one type of white pixel and yellow pixel, no matter the color-mixing pixel 20 is a complete white pixel, a complete yellow pixel, a partially yellow pixel, or a partially white pixel, the area of each color-mixing pixel 20 may be smaller than the area of any one of the primary-color pixels 10.

Figure 6:
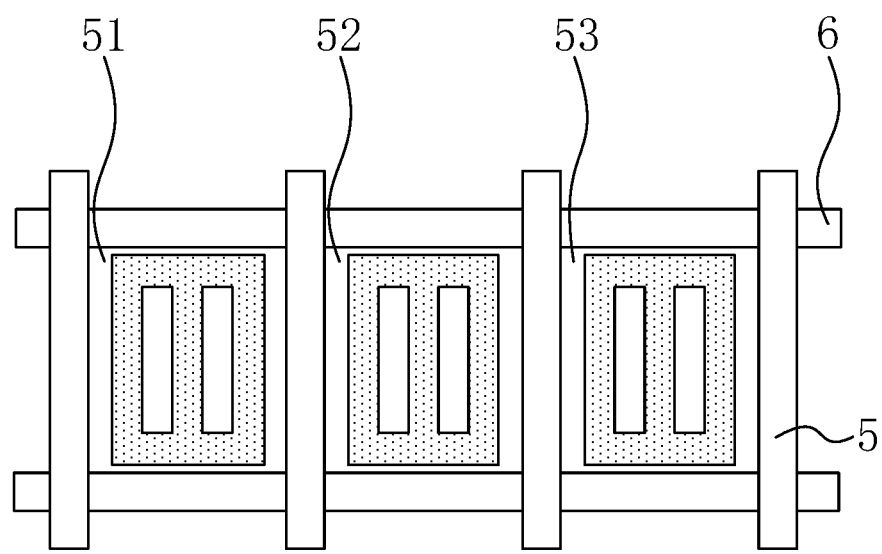
FIG. 6 illustrates a schematic top view of an existing pixel structure.

FIG. 6 illustrates a schematic top view of an existing pixel structure. As shown in FIG. 6, different from the display panel shown in FIG. 5, the display panel in FIG. 6 only includes three primary-color pixels, i.e., red pixels 51, green pixels 52 and blue pixel 53 each having the same area and configuration. That is, the display panel in FIG. 6 does not include any color-mixing pixels.

Figure 7:
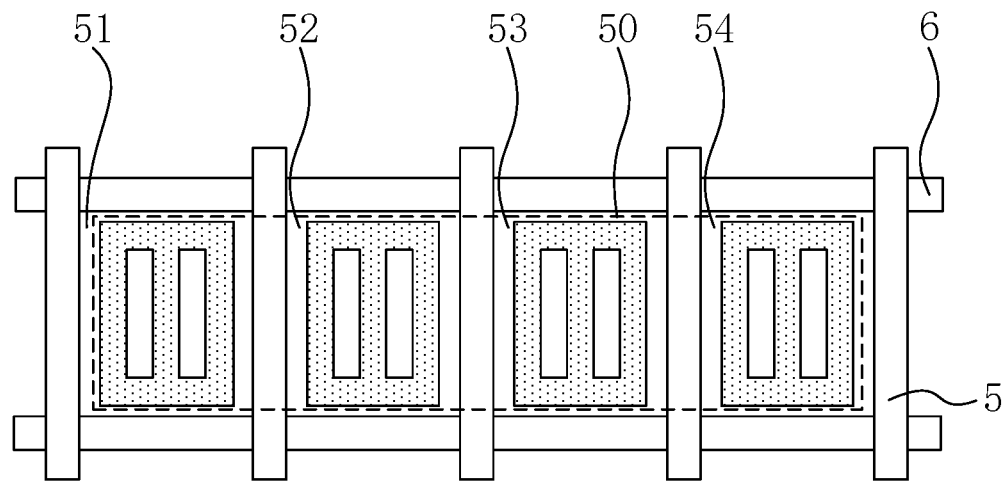
FIG. 7 illustrates a schematic top view of another existing pixel structure.

FIG. 7 illustrates a schematic top view of another existing pixel structure. As shown in FIG. 7, similar to the display panel shown in FIG. 5, the display panel in FIG. 7 also includes red pixels 51, green pixel 52, blue pixel 53, and color-mixing pixels 54, however, each of the red pixels 51, green pixel 52, blue pixel 53, and color-mixing pixels 54 has the same area and the same configuration. Further, each of the red pixels 51, green pixel 52, blue pixel 53, and color-mixing pixels 54 in FIG. 7 has the same area and the same configuration as each of the red pixels 51, green pixel 52, and blue pixel 53 in FIG. 6.

Further, the total area of a pixel unit 40 in FIG. 5 is the same as the total area of a pixel unit 50 in FIG. 7, in which the pixel unit 40 in FIG. 5 is formed by the red pixel 11, the green pixel 12, the blue pixel 13, and the color-mixing pixel 20, and the pixel unit 50 in FIG. 7 is formed by the red pixel 51, the green pixel 52, the blue pixel 53, and the color-mixing pixel 54. The color-mixing pixel 20 in FIG. 5 has a same type as the color-mixing pixel 54 in FIG. 7, for example, a white pixel.

Provided that the display panel in FIG. 6 is named as a basic display panel, the display panel in FIG. 7 is named as a comparative display panel, and the display panel in the disclosed embodiments is named as a disclosed display panel, the following Table 1 shows the properties and performance the three display panels.

TABLE 1

| Display panel | Primary-color pixels | Color-mixing pixel (white) | LC materials | Transmittance of the display panel | White color coordinate |
|---|---|---|---|---|---|
| Basic display panel (1$^{st}$ display panel) | Same as the 2$^{nd}$ and 3$^{rd}$ display panels | None | Same as the 2$^{nd}$ and 3$^{rd}$ display panels | 6.20% | (0.2924, 0.3096) |

TABLE 1-continued

| Display panel | Primary-color pixels | Color-mixing pixel (white) | LC materials | Transmittance of the display panel | White color coordinate |
|---|---|---|---|---|---|
| Comparative display panel (2$^{nd}$ display panel) | Same as the 1$^{st}$ and 3$^{rd}$ display panels | Same as the 3$^{rd}$ display panel | Same as the 1$^{st}$ and 3$^{rd}$ display panels | 9.10% | (0.2796, 0.2898) |
| Disclosed display panel (3$^{rd}$ display panel) | Same as the 1$^{st}$ and 2$^{nd}$ display panels | Same as the 2$^{nd}$ display panel | Same as the 1$^{st}$ and 2$^{nd}$ display panels | 8.60% | (0.2860, 0.2945) |

As shown in Table 1, the basic display panel (the 1$^{st}$ display panel in FIG. 6), the comparative display panel (the 2$^{nd}$ display panel in FIG. 7) and the disclosed display panel (the 3$^{rd}$ display panel in FIG. 5) all have the same primary color barrier/filters. That is, in the 1$^{st}$ to the 3$^{rd}$ display panels, the color barrier materials of the red pixels are the same, the color barrier materials of the green pixels are the same, and the color barrier materials of the blue pixels are the same. The comparative display panel (the 2$^{nd}$ display panel in FIG. 7) and the disclosed display panel (the 3$^{rd}$ display panel in FIG. 5) both have the same color-mixing pixels. That is, in the 2$^{nd}$ to the 3$^{rd}$ display panels, the color barrier materials of the color-mixing pixels are the same, and the type of the color-mixing pixels are the same, for example, white pixels in Table 1.

As shown in Table 1, the comparative display panel (the 2$^{nd}$ display panel in FIG. 7) and the disclosed display panel (the 3$^{rd}$ display panel in FIG. 5) each has significantly improved light transmittance as compared to the basic display panel (the 1$^{st}$ display panel in FIG. 6). Although the disclosed display panel (the 3$^{rd}$ display panel in FIG. 5) has slightly lower light transmittance than the comparative display panel (the 2$^{nd}$ display panel in FIG. 7), the light transmittance of the disclosed display panel (the 3$^{rd}$ display panel in FIG. 5) is still above 38%, which meets the luminance/brightness demand for high-resolution display panels.

The basic display panel (the 1$^{st}$ display panel in FIG. 6) is the most commonly existing display panel, and the color coordinates of the images can meet the user demand for the color saturation of the images. The image quality of new display panels (new technical solutions) is often determined based on the color coordinates of the basic display panel (the 1$^{st}$ display panel in FIG. 6). That is, the color coordinates of the basic display panel (the 1$^{st}$ display panel in FIG. 6) are often used as a base line to determine the image quality of new display panels (new technical solutions).

As shown in Table, the white color coordinates of the basic display panel (the 1$^{st}$ display panel in FIG. 6) are ( 0.2924, 0.3096), and the color saturation of the white image can better meet the user demands. The white color coordinates of the comparative display panel (the 2$^{nd}$ display panel in FIG. 7) are (0.2796, 0.2898), which has a substantially large deviation as compared with the white color coordinates of the basic display panel (the 1$^{st}$ display panel in FIG. 6). That is, the white color coordinates of comparative display panel (the 2$^{nd}$ display panel in FIG. 7) is beyond the user's tolerance of the color coordinates deviation, the color saturation of the white image is poor, thereby failing to meet the user demand.

Further, the white color coordinates of the disclosed display panel (the 3$^{rd}$ display panel in FIG. 5) are (0.2860, 0.2945), which has a substantially small deviation as compared with the white color coordinates of the basic display panel (the 1$^{st}$ display panel in FIG. 6). That is, the white color coordinates of the disclosed display panel (the 3$^{rd}$ display panel in FIG. 5) is within the user's tolerance of the color coordinates deviation, the color saturation of the white image is good, thereby meeting the user demand.

When the color-mixing pixel includes pixels other than the white pixel, such as a yellow pixel, on one hand, the disclosed display panel (the 3$^{rd}$ display panel in FIG. 5) may also have significantly improved light transmittance as compared to the basic display panel (the 1$^{st}$ display panel in FIG. 6), thereby meeting the luminance/brightness demand for the high-resolution display panels. On the other hand, as compared to the comparative display panel (the 2$^{nd}$ display panel in FIG. 7), the deviation of the white color coordinates in the disclosed display panel (the 3$^{rd}$ display panel in FIG. 5) may be reduced, enabling a desired color saturation of the images to meet the user demand.

Referring to FIG. 1, FIG. 3, FIG. 5, FIG. 6, FIG. 7 and Table 1, in the disclosed display panel (the 3$^{rd}$ display panel in FIG. 5), the area of the color-mixing pixel 20 may be configured to be smaller than the area of the primary-color pixel 10. Thus, as compared to the comparative display panel (the 2$^{nd}$ display panel in FIG. 7), in the disclosed display panel (the 3$^{rd}$ display panel in FIG. 5), the ratio/percentage of the color-mixing pixels 20 in the single pixel unit 40 and the entire display panel may be reduced and, accordingly, the ratio of the primary-color pixels 10 in the single pixel unit 40 and the entire display panel may be increased.

That is, in the disclosed embodiments, through configuring the area of the color-mixing pixel 20 to be smaller than the area of the primary-color pixel 10, the physical area ratio (i.e., the area ratio of the light exit surface) of the color-mixing pixels 20 in the single pixel unit 40 and the entire display panel may be substantially reduced. In other words, the area ratio of the light exit surface of the primary-color pixels 10 in the single pixel unit 40 and the entire display panel may be substantially increased.

Through substantially decreasing the area ratio of the light exit surface of the color-mixing pixels 20 while substantially increasing the area ratio of the light exit surface of the primary-color pixels 10 in the single pixel unit 40 and the entire display panel, the color coordinate deviation of the display panel including the color-mixing pixels 20 may be effectively reduced, which may enable a desired color saturation of the images to meet the user demand.

Further, in the disclosed embodiments, through increasing the width of the second electrode branch 2011 and decreasing the number of the second electrode branches 2011 in the color-mixing pixel 20, on one hand, the screen flicker may be suppressed. On the other hand, as the width of the second electrode branch 2011 in the color-mixing pixel 20 increases, the driving capability of the second electrode branch 2011 to the liquid crystal molecules in the color-mixing pixels 20 may be reduced, which may further reduce the light transmittance of the liquid crystal molecules in the color-mixing pixels 20. Thus, the luminance/brightness of the color-mixing pixels 20 may be reduced, and the percentage of the photons emitted from the color-mixing pixels 20 may also be reduced. Accordingly, the color coordinate deviation of the display panel including the color-mixing pixels 20 may be further reduced.

In the disclosed embodiments, the color coordinate deviation of the display panel including the color-mixing pixels 20 may be reduced. The color-mixing pixel 20 may be any appropriate type of color-mixing pixels, such as a white color pixel, a yellow color pixel, a cyan pixel, a magenta pixel, a partial white pixel, and a partial yellow pixel, etc., which is not limited by the present disclosure.

Similarly, in the display panel shown in FIG. 4, the area of the color-mixing pixel 20 may also be configured to be smaller than the area of the primary-color pixel 10, and the specific process and technical effects are similar to that in FIG. 5, which are not described herein again.

In certain embodiments, as shown in FIG. 2, FIG. 4, and FIG. 5, the primary-color pixel 10 may include a first electrode 101, and the first electrode 101 may include M number of stripe-shaped first electrode branches 1011. The color-mixing pixel 20 may include a second electrode 201, and the second electrode 201 may include N number of stripe-shaped second electrode branches 2011, where M−N=1, and both M and N are integers greater than zero.

Referring to FIG. 2, FIG. 4, and FIG. 5, through configuring the number of the second electrode branches 2011 to be smaller than the number of the first electrode branches 1011, a desired physical space for increasing the width of the second electrode branches 2011 may be provided. Through configuring M−N=1, i.e., the number of the second electrode branches 2011 is smaller than the number of first electrode branches 1011 by only one, the decrease in the luminance of the color-mixing pixels 20 may be ensured to be within a desired range. Thus, a significant increase in the overall brightness of the display panel by the color-mixing pixels 20 may not be affected.

In particular, through increasing the width of the second electrode branch 2011, the driving ability of the second electrode branches to the liquid crystal molecules in the color-mixing pixels 20 may be reduced, which may reduce the luminance/brightness of the color-mixing pixels 20.

In certain embodiments, as shown in FIGS. 2, 4, and 5, the width ratio D2/D1 between the second electrode branch 2011 D2 and the first electrode branch 1011 D1 may be configured to be approximately greater than 1 and less than or equal to 1.5. In practical applications, the width ratio D2/D1 between the second electrode branch 2011 and the first electrode branch 1011 may be determined according to various application scenarios, which is not limited by the present disclosure.

Referring to FIGS. 2, 4, and 5, the width D2 of the second electrode branch 2011 may be greater than the width D1 of the first electrode branch 1011, and the width D2 of the second electrode branch 2011 may be at most 1.5 times the width D1 of the first electrode branch 1011. The flicking performance of the display panel may be improved, the color coordinate deviation may be reduced and, meanwhile, a significant increase in the brightness of the images displayed by the display panel may be ensured.

However, when the width D2 of the second electrode branch 2011 is greater than 1.5 times the width D1 of the first electrode branch 1011, a gap with a sufficient width may be unable to be formed between the adjacent two second electrode branches 2011. Accordingly, the liquid crystal molecules in the color-mixing pixels 20 may not be effectively driven by the second electrode 201, and the brightness of the displayed images may not be significantly improved.

In one embodiment, the width D2 of the second electrode branch 2011 may be approximately 3.2 μm, and the width D1 of the first electrode branch 1011 may be approximately 2.4 μm.

In certain embodiments, as shown in FIG. 2, FIG. 4 and FIG. 5, the first electrode 101 may further include a first slit 102, which may be disposed between any two adjacent first electrode branches 1011. The second electrode 201 may further include a second slit 202, which may be disposed between any two adjacent second electrode branches 2011. The width direction of the first slit 102 may be perpendicular to the extending direction of the first electrode branch 1011, and the width direction of the second slit 202 may be perpendicular to the extending direction of the second electrode branch 2011

As shown in FIG. 2, FIG. 4 and FIG. 5, the width of the first slit 102 between any two adjacent first electrode branches 1011 is D3, and the width of the second slit 202 between any two adjacent second electrode branches 2011 is D4. In one embodiment, the width ratio D4/D3 between the second slit 202 and the first slit 102 may be approximately greater than or equal to 0.5 and less than or equal to 2.

In the disclosed embodiments, provided that the width of the second electrode branch 2011 is greater than the width of the first electrode branch 1011, and the number of the second electrode branches 2011 is less than the number of the first electrode branches 1011, through configuring the width ratio D4/D3 between the second slit 202 and the first slit 102 to be approximately greater than or equal to 0.5 and less than or equal to 2, the area of the color-mixing pixel 20 may be realized to be smaller than or equal to the area of the primary-color pixel 10.

In certain embodiments, the width D4 of the second slit 202 may be configured to be equal to the width D3 of the first slit 102. For example, D4 and D3 may be equal to 4 μm, respectively, thereby lowering the design complexity of the first electrode 101 and the second electrode 201, improving the fabrication feasibility, and reducing the fabrication and design costs.

Figure 8:
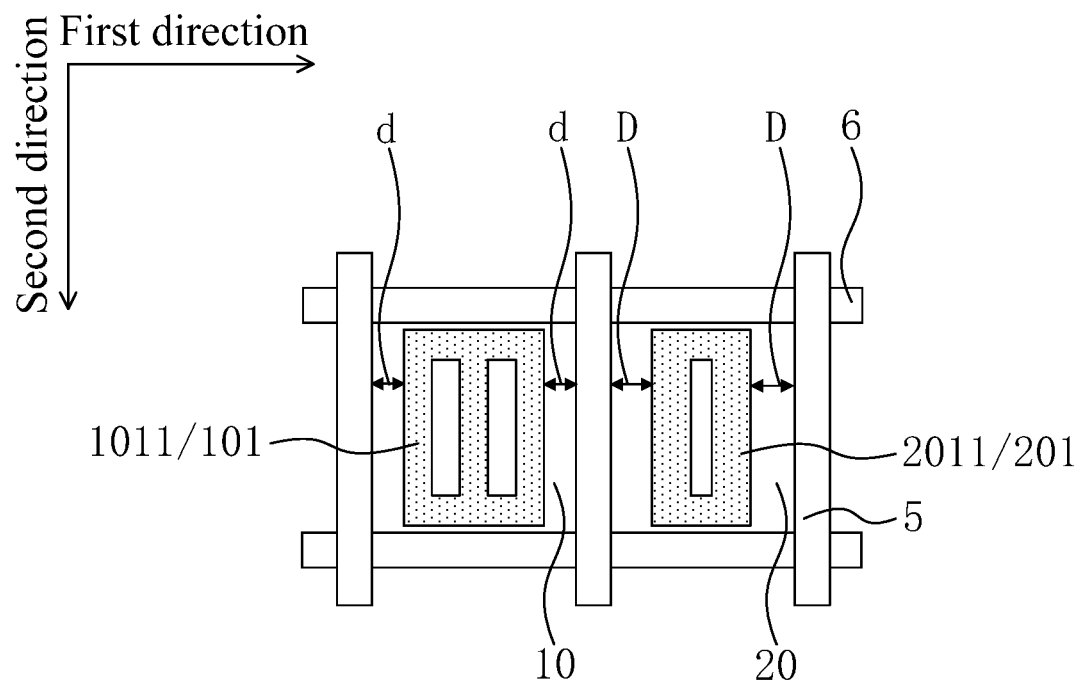
FIG. 8 illustrates a schematic top view of another exemplary display panel consistent with disclosed embodiments.

FIG. 8 illustrates a schematic top view of another exemplary display panel consistent with disclosed embodiments. As shown in FIG. 8, along a direction perpendicular to the extending direction of the second electrode branch 2011, the distance from each of the two boundaries of the second electrode 201 to the corresponding boundary of the closest color-mixing pixel 20 is D. In a direction perpendicular to the extending direction of the first electrode branch 1011, the distance from each of the two boundaries of the first electrode 101 to the corresponding boundary of the closest primary-color pixels 10 is d, where D and d are greater than 0, and D>d.

In one embodiment, In the direction perpendicular to the extending direction of the second electrode branch 2011, the distance from each of the two boundaries of the second electrode 201 to the corresponding boundary of the closest color-mixing pixel 20 may be equal and may be D. That is, the shortest distance between from each of the two boundaries of a second electrode 201 to the corresponding boundary of the color-mixing pixel 20 including the second electrode 201 may be equal and may be D. In the direction perpendicular to the extending direction of the first electrode branch 1011, the distance from each of the two boundaries of the first electrode 101 to the corresponding boundary of the closest primary-color pixels 10 may be equal and may be d. That is, the shortest distance between from each of the two boundaries of a first electrode 101 to the corresponding boundary of the primary-color pixels 10 including the first electrode 101 may be equal and may be d.

In the disclosed embodiments, through configuring D>d, the driving capability of the second electrode 201 to the liquid crystal molecules at the edge of the color-mixing pixel 20 may be reduced, which may further reduce the light transmittance of the liquid crystal molecules at the edge of the color-mixing pixel 20, reduce the luminance/brightness of the color-mixing pixels 20, and reduce the percentage of the photons emitted from the color-mixing pixels 20. Accordingly, the color coordinate deviation of the display panel including the color-mixing pixels 20 may be further reduced.

In the disclosed embodiments, the extending directions of the first electrode branch 1011 and the second electrode branch 2011 may be referred to FIG. 2 and FIG. 4, which is not repeated here.

Certain exemplary types and arrangements of the primary-color pixels and the color-mixing pixel will be illustrated as follows.

Figure 9:
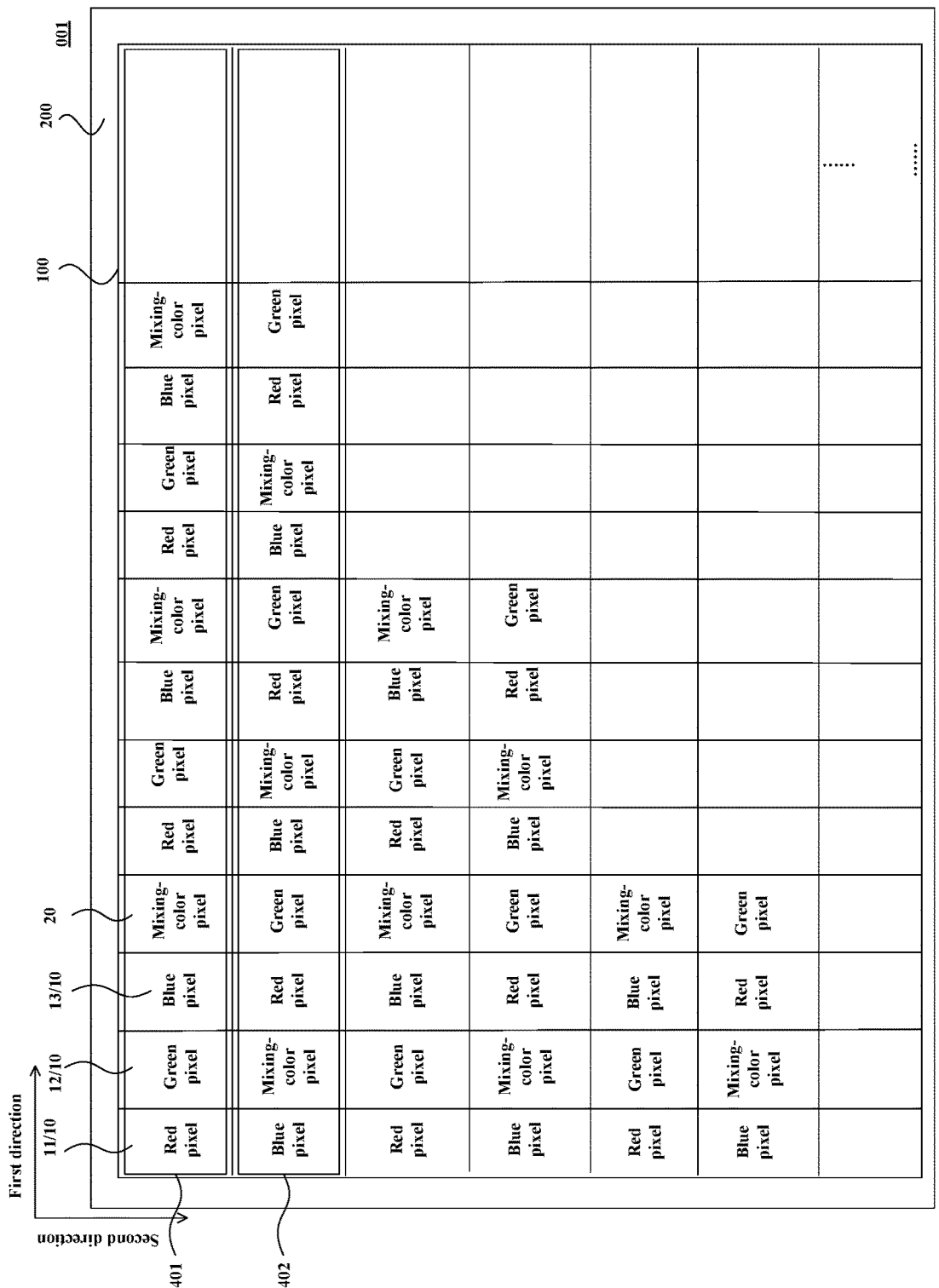
FIG. 9 illustrates a schematic top view of an exemplary pixel layout in an exemplary display panel consistent with disclosed embodiments.

FIG. 9 illustrates a schematic top view of an exemplary pixel layout in an exemplary display panel consistent with disclosed embodiments. As shown in FIG. 1, FIG. 2, FIG. 4, FIG. 5, and FIG. 9, the primary-color pixels 10 may include red pixels 11, green pixels 12, and blue pixels 13. The red pixels 11, the green pixels 12, the blue pixels 13, and the color-mixing pixels 10 may be repeatedly arranged in the display area 100 in the following smallest repeatable unit:

| Red pixel | Green pixel | Blue pixel | Color-mixing pixel |
|---|---|---|---|
| Blue pixel | Color-mixing pixel | Red pixel | Green pixel |

As shown in FIG. 9, whether in the first direction or the second direction, the red pixels 11, the green pixels 12, the blue pixels 13, and the color-mixing pixels 10 may be repeatedly arranged in the display area 100 in the following smallest repeatable unit, thereby forming color display units for the display panel.

| Red pixel | Green pixel | Blue pixel | Color-mixing pixel |
|---|---|---|---|
| Blue pixel | Color-mixing pixel | Red pixel | Green pixel |

The display area 100 may include a plurality of first pixel rows 401 and a plurality of second pixel rows 402. In particular, in the first pixel row 401, the primary-color pixels 10 and the color-mixing pixel 20 may be repeatedly arranged in the sequence of the red pixel 11, the green pixel 12, the blue pixel 13, and the color mixing pixel 20. In the second pixel row 402, the primary-color pixels 10 and the color-mixing pixel 20 may be repeatedly arranged in the sequence of the blue pixel 13, the color-mixing pixel 20, the red pixel 11, and the green pixel 12. The first pixel rows 401 and the second pixel rows 402 may be adjacently arranged, and in the entire display panel 001, the first pixel rows 401 and the second pixel rows 402 may be alternately arranged along the second direction.

In the disclosed embodiments, the red pixel 11, the green pixel 12, the blue pixel 13 and the color-mixing pixel 20 may be arranged in the nearest neighbor manner, such that the image performance may be enhanced in delicacy, and the image quality may be improved.

The present disclosure further provides a display device comprising any one of the disclosed display panel.

Figure 10:
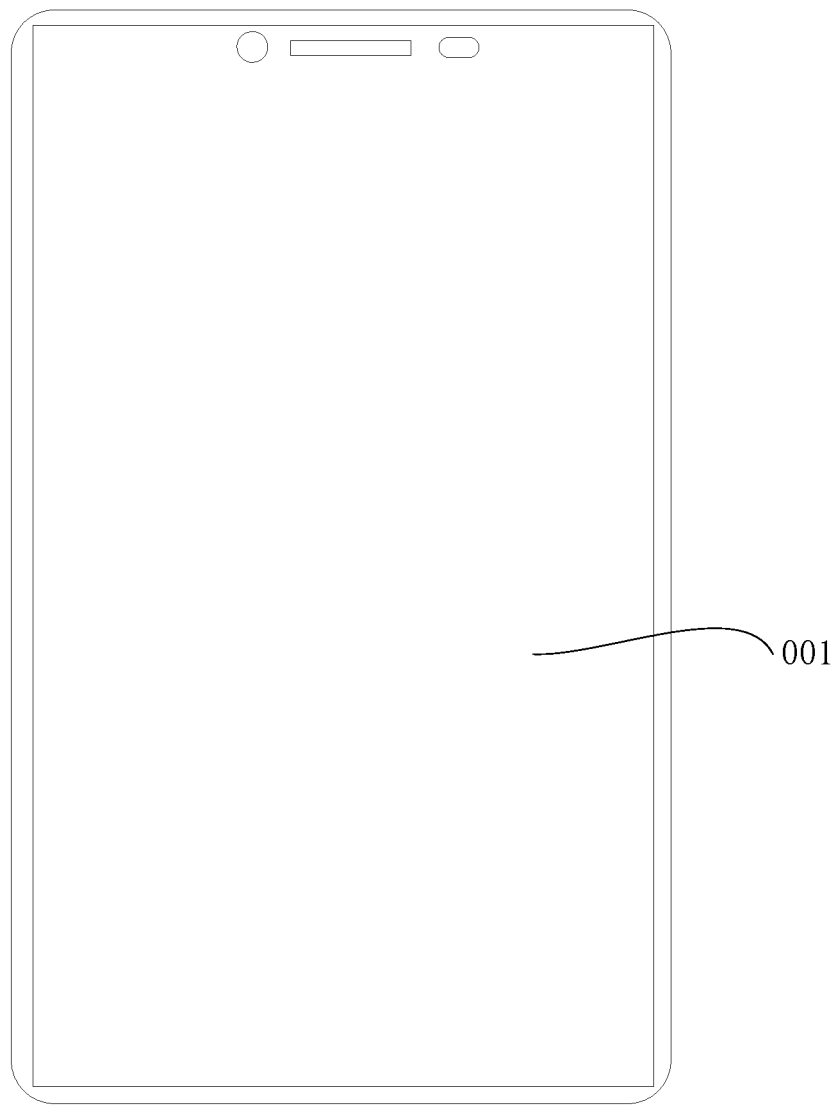
FIG. 10 illustrates a schematic view of an exemplary display device consistent with disclosed embodiments.

FIG. 10 illustrates a schematic view of an exemplary display device 300 consistent with disclosed embodiments. As shown in FIG. 10, the display device 300 may include a display panel 001, which may be any one of the disclosed display panel. The display device 300 may be a mobile phone including the display panel 001. In addition, the display device 300 may also be any appropriate display device, such as a smart watch, a computer, or a television, which is not limited by the present disclosure. Because the display device includes any one of the disclosed display panels, the display device may exhibit the same features the disclosed display panels, which are not repeated here.

In the discoid embodiments, through configuring the width D2 of the second electrode branch in the color-mixing pixel to be greater than the width D1 of the first electrode branch in the primary-color pixel, and the number of the second electrode branches in the color-mixing pixel to be smaller than the first electrode branches in the primary-color pixel, the brightness of the display screen may be enhanced and, meanwhile, the flicker of the display screen may be suppressed. That is, the flickering performance of the display panel may be improved.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments, but may be embodied in other equivalent forms without departing from the scope of the present disclosure, which is determined by the appended claims.

What is claimed is:

1. A display panel, comprising:
    a display area;
    a non-display area surrounding the display area; and
    a plurality of primary-color pixels and a plurality of color-mixing pixels disposed in the display area,
    wherein a primary-color pixel includes a first electrode, and the first electrode includes M number of stripe-shaped first electrode branches,
    a color-mixing pixel includes a second electrode, and the second electrode includes N number of stripe-shaped second electrode branches, where M>N, and both M and N are integers greater than 0, and
    a width D2 of the second electrode branch is greater than a width D1 of the first electrode branch.

2. The display panel according to claim 1, wherein:
    an area of the color-mixing pixel is smaller than an area of the primary-color pixel.

3. The display panel according to claim 2, wherein:
    along a direction perpendicular to an extending direction of the second electrode branch, a distance from each of two boundaries of the second electrode to a corresponding boundary of a closest color-mixing pixel is D; and
    in a direction perpendicular to an extending direction of the first electrode branch, a distance from each of two boundaries of the first electrode to a corresponding boundary of a closest primary-color pixels is d, where D and d are greater than 0, and D>d.

4. The display panel according to claim 1, wherein:
M−N=1.

5. The display panel according to claim 1, wherein:
a ratio of D2/D1 is approximately greater than 1 and less than or equal to 1.5.

6. The display panel according to claim 4, wherein:
the width D2 of the second electrode branch is approximately 3.2 μm, and the width D1 of the first electrode branch is approximately 2.4 μm.

7. The display panel according to claim 1, wherein:
the first electrode further includes a first slit disposed between any two adjacent first electrode branches, and the first slit has a width D3;
the second electrode further includes a second slit disposed between any two adjacent second electrode branches, and the second slit has a width D4; and
a ratio of D4/D3 is approximately greater than or equal to 0.5 and less than or equal to 2.

8. The display panel according to claim 1, further comprising:
a plurality of data lines and a plurality of gate lines,
wherein in the display area, the plurality of gate lines are extending in a first direction and arranged in a second direction, and plurality of data lines are extending in the second direction and arranged in the first direction,
the first electrode branch and the second electrode branch are extending in the second direction, and
a width direction of the first electrode branch and the second electrode branch is the first direction.

9. The display panel according to claim 1, wherein:
an area of the color-mixing pixel is equal to an area of the primary-color pixel.

10. The display panel according to claim 1, further comprising:
a common electrode,
wherein the first electrode and the second electrode are pixel electrodes, and the common electrode is disposed on a layer different from the first electrode and the second electrode.

11. The display panel according to claim 1, wherein:
the color-mixing pixel includes at least one type of white pixel and yellow pixel.

12. The display panel according to claim 1, wherein:
the primary-color pixels include red pixels, green pixels, and blue pixels; and
the red pixels, the green pixels, the blue pixels, and the color-mixing are repeatedly arranged in the display area in a following smallest repeatable unit:

| Red pixel | Green pixel | Blue pixel | Color-mixing pixel |
|---|---|---|---|
| Blue pixel | Color-mixing pixel | Red pixel | Green pixel. |

13. A display device, comprising:
a display panel,
wherein the display panel comprises:
a display area;
a non-display area surrounding the display area; and
a plurality of primary-color pixels and a plurality of color-mixing pixels disposed in the display area,
wherein a primary-color pixel includes a first electrode, and the first electrode includes M number of stripe-shaped first electrode branches,
a color-mixing pixel includes a second electrode, and the second electrode includes N number of stripe-shaped second electrode branches, where M>N, and both M and N are integers greater than 0, and
a width D2 of the second electrode branch is greater than a width D1 of the first electrode branch.

14. The display device according to claim 13, wherein:
an area of the color-mixing pixel is smaller than an area of the primary-color pixel.

15. The display device according to claim 14, wherein:
along a direction perpendicular to an extending direction of the second electrode branch, a distance from each of two boundaries of the second electrode to a corresponding boundary of a closest color-mixing pixel is D; and
in a direction perpendicular to an extending direction of the first electrode branch, a distance from each of two boundaries of the first electrode to a corresponding boundary of a closest primary-color pixels is d, where D and d are greater than 0, and D>d.

16. The display device according to claim 13, wherein:
M−N=1.

17. The display device according to claim 13, wherein:
a ratio of D2/D1 is approximately greater than 1 and less than or equal to 1.5.

18. The display device according to claim 13, wherein:
the first electrode further includes a first slit disposed between any two adjacent first electrode branches, and the first slit has a width D3;
the second electrode further includes a second slit disposed between any two adjacent second electrode branches, and the second slit has a width D4; and
a ratio of D4/D3 is approximately greater than or equal to 0.5 and less than or equal to 2.

* * * * *